(12) United States Patent
Mao et al.

(10) Patent No.: US 8,206,824 B2
(45) Date of Patent: Jun. 26, 2012

(54) PARTICLE-ROD NANOSTRUCTURES

(75) Inventors: Guangzhao Mao, Northville, MI (US); Stephanie L. Brock, Ferndale, MI (US); Dongzhong Chen, Longjian Community of Gulo (CN); Ruomiao Wang, Detroit, MI (US); Indika U. Arachchige, Detroit, MI (US)

(73) Assignee: Wayne State University, Detroit, MI (US)

( * ) Notice: Subject to any disclaimer, the term of this patent is extended or adjusted under 35 U.S.C. 154(b) by 81 days.

(21) Appl. No.: 12/726,985

(22) Filed: Mar. 18, 2010

(65) Prior Publication Data

US 2010/0183875 A1    Jul. 22, 2010

Related U.S. Application Data

(62) Division of application No. 11/486,663, filed on Jul. 14, 2006, now Pat. No. 7,709,054.

(60) Provisional application No. 60/700,611, filed on Jul. 19, 2005.

(51) Int. Cl.
| | |
|---|---|
| C08K 7/00 | (2006.01) |
| C08K 3/10 | (2006.01) |
| C08K 5/09 | (2006.01) |
| C08K 3/30 | (2006.01) |
| B32B 5/16 | (2006.01) |
| C09C 1/10 | (2006.01) |

(52) U.S. Cl. ........ 428/372; 428/402; 428/403; 428/407; 977/773; 977/778; 977/782

(58) Field of Classification Search ........... 428/402–407
See application file for complete search history.

(56) References Cited

U.S. PATENT DOCUMENTS

| 7,067,237 B2 | 6/2006 | Kim et al. |
| 7,537,803 B2 | 5/2009 | Wang et al. |
| 7,588,828 B2 | 9/2009 | Mushtaq et al. |
| 7,709,054 B2 | 5/2010 | Mao et al. |
| 2003/0209057 A1 | 11/2003 | Yadav et al. |
| 2004/0007956 A1 | 1/2004 | Chen |
| 2004/0139888 A1 | 7/2004 | Yadav et al. |
| 2004/0166642 A1 | 8/2004 | Chen et al. |
| 2005/0235776 A1* | 10/2005 | He et al. .................. 75/255 |
| 2007/0104865 A1 | 5/2007 | Pickett |
| 2008/0292789 A1 | 11/2008 | Sun et al. |

FOREIGN PATENT DOCUMENTS

WO    2004/053501 A2    6/2004

OTHER PUBLICATIONS

"Carbide Nanorods Developed at Harvard", Edited by Dr. Thomas Abraham, Tech Ceramics News, Norwalk, CT (Jun. 1996).
"Crystalline and Noncrystalline Solids", Edited by N.B. Hannay, Treatise on Solid State Chemistry, vol. 3, Plenum Press, New York (1976).

(Continued)

*Primary Examiner* — Hoa (Holly) Le
*Assistant Examiner* — Ronak Patel
(74) *Attorney, Agent, or Firm* — Brinks Hofer Gilson & Lione

(57) ABSTRACT

A particle-rod nanostructure is disclosed. The nanostructure comprises an inorganic nanoparticle coated with a capping agent and an organic crystalline rod nucleated on the capped inorganic nanoparticle in a one-dimensional growth pattern.

13 Claims, 3 Drawing Sheets

OTHER PUBLICATIONS

"Nanoparticle: Synthesis, Properties and Applications", Edelstein & Cammarata, Table of Contents (1996).

"Nanorods", edited by Lawrence Kren, Electronics in the News, Machine Design, Sep. 7, 2000.

A. Cacciuto et al., entitled "Onset of heterogeneous crystal nucleation in colloidal suspensions," Nature, vol. 428, Mar. 25, 2004, pp. 404-406.

Cao, Younam, and Braun "Nanomaterials and Their Optical Applications", Proceedings of SPIE, Table of Contents, San Diego, CA (Aug. 5, 2003).

Chad A. Mirkin, et al., entitled "A DNA-based method for rationally assembling nanoparticles into macroscopic materials," Nature, vol. 382, No. 15, Aug. 1996, pp. 607-609.

Dongzhong Chen, et al., entitled "Particle-Rod Hybrids: Growth of Arachidic Acid Molecular Rods from Capped Cadmium Selenide Nanoparticles," J. Am. Chem. Soc. 2004, vol. 126, No. 50, pp. 16290-16291.

G.C. McGonigal et al., entitled "Imaging alkane layers at the liquid/graphite interface with the scanning tunneling microscope," Appl. Phys. Lett., vol. 57, No. 1, Jul. 2, 1990, pp. 28-30.

Guangzhao Mao et al., entitled "Synthesis of Copper Sulfide Nanorod Arrays on Molecular Templates," Nano Lett., vol. 4, No. 2, 2004, pp. 249-252.

Jian Tao et al., entitled "Asymmetrical Molecular Aggregation in Spherulitic Dye Films," J. Am. Chem. Soc., vol. 121, No. 14, 1999, pp. 3475-3485.

Jose Aldana et al., entitled "Photochemical Instability of CdSe Nanocrystals Coated by Hydrophilic Thiols," J. Am. Chem. Soc., vol. 123, No. 36, 2001, pp. 8844-8850.

Julia Pierce, entitled "Nanorods cut cost of solar power," The Engineer, vol. 5, Apr. 2002, p. 7.

Jurgen P. Rabe et al., entitled "Commensurability and Mobility in Two-Dimensional Molecular Patterns on Graphite," Science, New Series, vol. 253, No. 5018, Jul. 26, 1991, pp. 424-427.

K. Meine et al., entitled "Atomic Force Microscopy and X-ray Studies of Three-Dimensional Islands on Monolayers," Langmuir, vol. 13, No. 24, 1997, pp. 6577-6581.

Kimberly A. Dick et al., entitled "Synthesis of branched 'nanotrees' by controlled seeding of multiple branching events," Nature Materials, vol. 3, Jun. 2004, pp. 380-384.

Konstantinos Chondroudis, et al., entitled "Electroluminescence from an Organic—Inorganic Perovskite Incorporating a Quaterhiophene Dye within Lead Halide Perovskite Layers," Chem. Mater. 1999, vol. 11, No. 11, pp. 3028-3030.

Laura Ann Bauer et al, entitled "Biological applications of high aspect ratio nanoparticles," J. Mater. Chem., 2004, vol. 14, pp. 517-526.

Liberato Manna, et al., entitled Synthesis of Soluble and Processable Rod-, Arrow-, Teardrop-, and Tetrapod-Shaped CdSe Nanocrystals, J. Am. Chem. Soc. 2000, vol. 122, No. 51, pp. 12700-12706.

Lincoln J. Lauhon et al., entitled Epitaxial core-shell and core-multishell nanowire heterostructures, Nature, vol. 420, Nov. 7, 2002, pp. 57-61.

Louis C. Brousseau, III. et al., entitled "pH-Gated Single-Electron Tunneling in Chemically Modified Gold Nanoclusters," J. Am. Chem. Soc. 1998, vol. 120, No. 30, pp. 7645-7646.

Lowenstam and Weiner "On Biomineralization", Oxford University Press, New York (1989).

Masahiro Hibino et al., entitled "Atomic Images of Saturated and Unsaturated Fatty Acids at Liquid/Graphite Interface and Difference of Tunneling Currents between Them Observed by Scanning Tunneling Microscopy," Jpn. J. Appl. Phys., vol. 34, Pt. 1, No. 2A, Feb. 1995, pp. 610-614.

Nanosys and Intel to Investigate Nanotechnology-Enabled Memory, http://www.nanotechwire.com/news.asp?nid=630, Jan. 14, 2004.

Nikolai Severin et al., entitled "Fully Extended Polyelectrolyte—Amphiphile Complexes Adsorbed on Graphite," J. Am. Chem. Soc., vol. 126, No. 12, 2004, pp. 3696-3697.

P.G. de Gennes, entitled "Wetting: statics and dynamics," Reviews of Modern Physics, vol. 57, No. 3, Part I, Jul. 1985, pp. 827-863.

Publication entitled "Electronics in the News (Nanorods)," Machine Design, www.machinedesign.com, Sep. 7, 2000, p. 52.

Publication entitled "Sneak Preview (Breakthroughs on the Horizon) Solar cells on plastic," Design News, www.designnews.com, Aug. 19, 2002, p. 16.

Publication entitled "Three-Element Nanorods (Nanometer-sized crystalline oxide rods exhibit useful properties)," C & E N, http://pubs.acs.org/cen, Mar. 4, 2001, p. 11.

S. M. M. Ramos et al., entitled "Wetting on nanorough surfaces," Physical Review E 67, 031604, 2003, pp. 1-6.

Sato, "Crystallization Processes in Fats and Lipid Systems", Edited by Nissim Garti, Marcel Dekker, Inc., New York (2001).

Sherri Carmody, entitled "Nanoscale selenium may lead to faster electronics," Machine Design, Apr. 1, 2004, vol. 76, No. 7, p. 48.

Stephanie Hoeppener et al., entitled "Molecular-Template-Mediated Chemical Decoration," Chemphyschem, 2003, vol. 4, pp. 490-494.

T.E. Mallouk et al., entitled "Nanowires as building blocks for Self-Assembling Logic and Memory Circuits," Chem. Eur. J. 2002, vol. 8, No. 19, pp. 4354-4363.

Viscardo Malta et al., entitled "Crystal Structure of the C Form of Stearic Acid," J. Chem. Soc. (B), 1971, pp. 548-553.

Younan Xia, et al., entitled One-Dimensional Nanostructures: Synthesis, Characterization, and Applications, Adv. Mater. 2003, vol. 15, No. 5, Mar. 4, 2003, pp. 353-389.

Z. Adam Peng et al., entitled "Nearly Monodisperse and Shape-Controlled CdSe Nanocrystals via Alternative Routes: Nucleation and Growth," J. Am. Chem. Soc. 2002, vol. 124, No. 13, pp. 3343-3353.

Zhiyong Tang et al., entitled "Spontaneous Organization of Single CdTe Nanoparticles into Luminescent Nanowires," Science, vol. 297, Jul. 12, 2002, pp. 237-240.

Zong Lin Wang, entitled "Functional Oxide Nanobelts: Materials, Properties and Potential Applications in Nanosystems and Biotechnology," Annu. Rev. Phys. Chem., vol. 55, 2004, pp. 159-196.

* cited by examiner

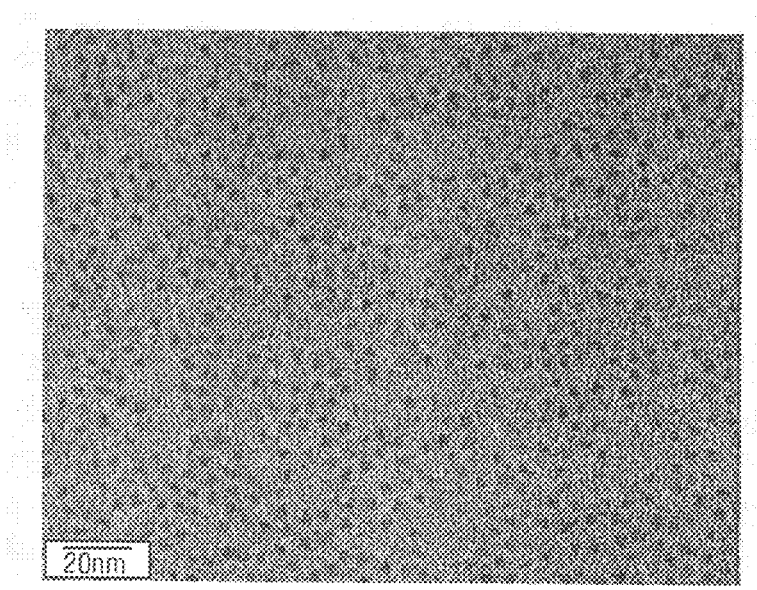
Fig. 5
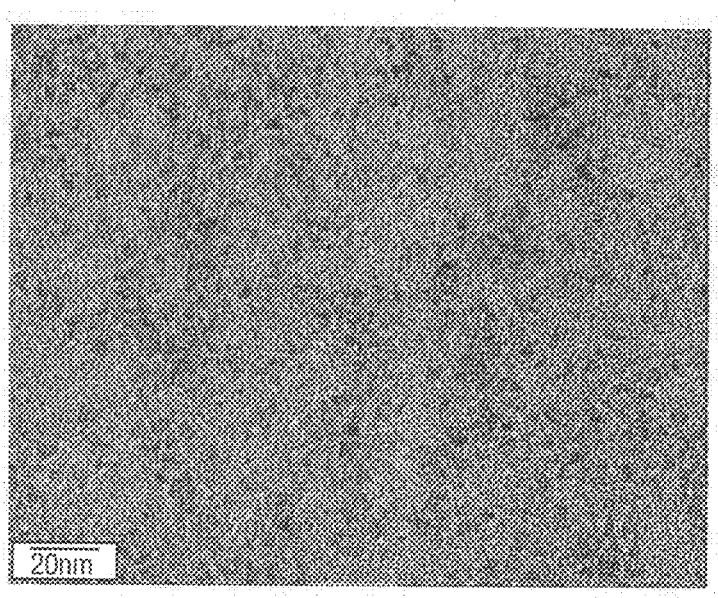
Fig. 6
| CdSe | MUA SYNTHESIS RATIO | Cd | Se | S OBSERVED |
|---|---|---|---|---|
| 1 | 3 | 1.00 | 1.04 | 0.38 |
| 1 | 5 | 1.00 | 1.20 | 0.50 |
| 1 | 10 | 1.00 | 1.03 | 0.68 |
Fig. 7

PARTICLE-ROD NANOSTRUCTURES

CROSS-REFERENCE TO RELATED APPLICATION

This application is a divisional of U.S. patent application Ser. No 11/486,663, filed Jul. 14, 2006, entitled "PARTICLE-ROD NANO STRUCTURES AND METHOD OF FORMING SAME," which claims the benefit of U.S. Provisional Patent Application Ser. No. 60/700,611, filed on Jul. 19, 2005, the entire contents of which are incorporated herein by reference.

FEDERALLY SPONSORED RESEARCH AND DEVELOPMENT

This invention was made with government support under Contract Nos. CTS-0221586 and CTS-0216109 awarded by the U.S. National Science Foundation. The U.S. government may retain certain rights to the invention.

FIELD OF THE INVENTION

The present invention relates to particle-rod nanostructures. More particularly, the invention relates to particle-rod nanostructures comprising an inorganic nanoparticle coated with a capping agent.

BACKGROUND OF THE INVENTION

Organic-inorganic hybrids form the basis of biomineralization. Organic-inorganic hybrids may be used for electronic, optical, and biosensing applications. Such materials combine and enhance the functionalities of different material groups. For example, junctions between self-assembled monolayers and metal nanoparticles allow for the study of single electron transfer processes. Room temperature light-emitting diodes (LEDs) are created by the incorporation of a dye molecule within a perovskite framework. Attachment of oligonucleotides to gold nanoparticles triggers the self-assembly of DNA/nanoparticle arrays for biosensing and DNA sequencing.

With the drive towards device miniaturization, there is a desire for functional units such as nanoparticles and nanorods to be connected in a predefined manner. Thus, in addition to the synthesis of nanoparticles and nanorods, an emerging focus is on connecting and assembling the various nano-units.

BRIEF SUMMARY OF THE INVENTION

The present invention generally provides a particle-rod nanostructure comprising an inorganic nanoparticle coated with a capping agent. The nanostructure further comprises an organic molecule nucleated on the capped inorganic nanoparticle in a one-dimensional growth pattern.

In another example, the present invention provides a particle-rod nanostructure comprising a mercaptoundecanoic acid-capped cadmium selenide nanoparticle. The nanostructure further comprises one or more arachidic acid single-crystalline rods nucleated on the mercaptoundecanoic acid-capped cadmium selenide nanoparticle in a one-dimensional growth pattern.

In still another example, the present invention provides a particle-rod nanostructure system. The system comprises a film laminate including an organic stripe phase layer deposited on a substrate, a capped inorganic nanoparticle deposited on the organic stripe phase layer, and an organic molecule nucleated on the surface of the inorganic nanoparticle in a one-dimensional pattern.

Further objects, features, and advantages of the present invention will become apparent from consideration of the following description and the appended claims when taken in connection with the accompanying drawings.

BRIEF DESCRIPTION OF THE DRAWINGS

FIG. 5 is a transmission electron microscope (TEM) image of cadmium selenide nanoparticles prior to capping with mercaptoundecanoic acid in accordance with one example of the present invention;

FIG. 6 is a TEM image of mercaptoundecanoic acid-capped cadmium selenide nanoparticles in accordance with one example of the present invention;

FIG. 7 is a table depicting elemental compositions of cadmium selenide-mercaptoundecanoic acid capped nanoparticles.

DETAILED DESCRIPTION OF THE INVENTION

Figure 1:
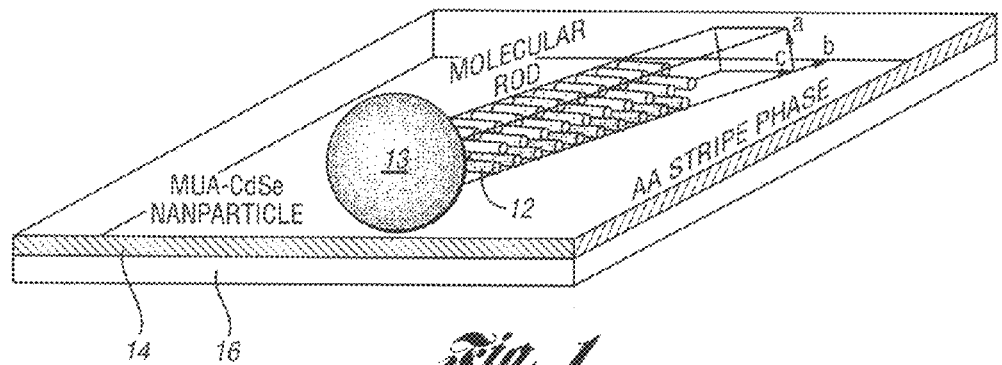
FIG. 1 is a perspective view of a conceptual image of a particle-rod nanostructure formed on a stripe phase layer on a substrate in accordance with one example of the present invention.

An example of the present invention comprises a method of forming a particle-rod nanostructure for electronic, optical, and bio-sensing applications. The particle-rod nanostructure includes an inorganic nanoparticle and an organic crystalline rod formed from the surface thereof in a one-dimensional growth pattern. One example of the method of forming the nanostructure comprises preparing a mixture comprising inorganic nanoparticles with a capping agent and an organic molecule in a solvent. The mixture is spin-coated to yield the particle-rod nanostructure on a substrate. In this example, the spin-coating causes evaporation of the solvent and involves precipitating an organic stripe phase layer. Spin-coating further involves depositing the capped nanoparticle on the stripe phase layer and nucleating the organic crystalline rod in a one-dimensional growth pattern from the surface of the nanoparticle.

When the solvent evaporates, the solvent "pools" or gathers about the nanoparticle, and nucleation of organic crystalline rods begins in a one-dimensional pattern. Nucleation may be defined as a stage in the process of forming the particle-rod nanostructure whereby organic molecules, e.g., alkane derivatives, experience a phase transition between an amorphous state and a crystalline state. Although not wanting to be limited by theory, it is believed that the clusters of the organic molecules overcome a critical nucleation barrier wherein a critical nucleation energy and a critical nucleation size are to be reached for the organic molecular clusters to undergo a crystallization phase transformation.

The inorganic nanoparticles serve as a "defect" within the organic molecules and thus serve as a center for nucleation.

That is, the defect feature of the nanoparticles affects the critical nucleation barrier by lowering the critical nucleation energy, allowing the organic molecular clusters to more easily reach the critical size and nucleate from the surface of the nanoparticle in a one-dimensional growth pattern. Once the critical size is reached, it is believed that there is a thermodynamic driving force or kinetic affinity toward crystal growth in an anisotropic and one-dimensional manner, resulting in the organic nanorods. It is further believed that during spin-coating each of the nanoparticles traps solvent around it, causing high concentrations to occur and activating nucleation of the organic nanorods in the one-dimensional pattern.

The nanoparticle of the present invention preferably comprises inorganic materials such as cadmium selenide nanocrystals. In one example, the cadmium selenide (CdSe) nanocrystals are of various sizes having a diameter between about 2 nanometers (nm) and 30 nm. Moreover, the nanocrystals may have varying aspect ratios (isometric nanoparticles and anisotropic nanoparticles (e.g., rods)). Cadmium selenide nanoparticles exist in amorphous and crystalline states. In this example, the cadmium selenide nanocrystals are preferably in the crystalline state. Although the nanoparticles are preferably cadmium selenide nanocrystals, the nanoparticles may comprise other suitable nanoparticles such as the metal chalcogenide nanoparticles cadmium sulfide, cadmium telluride, zinc sulfide, zinc selenide, and lead sulfide. Additionally, gold nanoparticles may also be used.

The organic molecule, e.g., alkane derivative, in accordance with one example of the present invention comprises fatty acids and other amphiphiles. In this example, the organic molecules are alkane derivatives, being long-chain carboxylic acids, and preferably are arachidic acid and stearic acid. However, phospholipids such as 1,2-dimyristoyl-sn-glycero-3-phosphoethanolamine and 10,12-pentacosadiynoic acid, and metal ion complexes of fatty acids (also called fatty acid soaps) such as copper arachidate and manganese arachidate may be used without falling beyond the scope or spirit of the present invention.

The solvent of the present invention preferably comprises organic solvents, including short-chain alcohols. For example, the solvent may include methanol, ethanol, isopropanol (also called isopropyl alcohol), butanol, chloroform, tetrahydrofuran (THF), m-cresol, and mixtures thereof. In this example, ethanol or isopropyl alcohol is preferably used.

The substrate in accordance with one example of the present invention preferably comprises highly oriented pyrolytic graphite (HOPG). The capping agent is preferably mercaptoundecanoic acid (MUA) or mercaptohexadecanoic acid (MHA).

Figure 2:
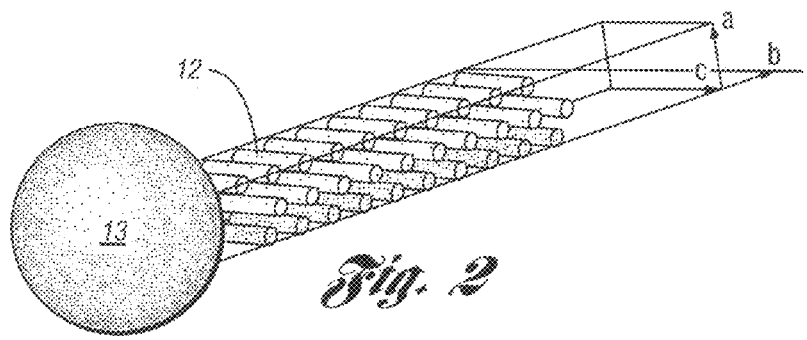
FIG. 2 is an elevated view of a conceptual image of the particle-rod nanostructure of FIG. 1.

Referring to FIGS. 1 and 2, organic crystalline rods 12 are formed by crystalline lattice unit cells (here, arachidic acid unit cells) attaching to each other along the b direction during crystallization. FIGS. 1 and 2 show the crystalline packing structure of the organic crystalline rod 12 in relation to a nanoparticle 13 along with a stripe phase layer 14 and an HOPG layer 16. In this example, the alkyl chain includes a zigzag plane that is substantially parallel to the particle-rod interface, but substantially perpendicular to the HOPG substrate, unlike the underlying stripe phase layer wherein the alkyl chain zigzag plane is parallel to the HOPG basal plane. This shows that the organic crystalline rods are nucleated directly from the nanoparticle.

In one method of the present invention, inorganic nanoparticles are prepared. In one example of the method, high-temperature cadmium selenide (CdSe) nanoparticles are prepared. In this example, between about 1 and 2 weight % of cadmium oxide (CdO), between about 2 and 3 weight % of tetradecylphosphonic acid (TDPA), and between about 95 and 97 weight % of trioctylphosphineoxide (TOPO) are mixed together, defining a TOPO-TDPA mixture. The TOPO-TDPA mixture is slowly heated to between about 300 degrees Celsius (° C.) and 320° C. under an Argon (Ar) flow. At about 300° C., the cadmium oxide powder, having a reddish brown pigment, dissolves in the TOPO-TDPA mixture to form a homogeneous colorless solution.

In this example, the temperature of the solution is then cooled down to about 270° C., and a selenium (Se) solution of between about 0.5 and 1% weight is quickly injected therein. As a result, cadmium selenide (CdSe) nanocrystals are formed at about 250° C. over about 4 hours and precipitated with methanol. At this stage, the CdSe nanocrystals have a combination of TOPO and TDPA capped on the surface thereof.

The cadmium selenide nanocrystals are then preferably thiol coated/capped with a capping agent, e.g., mercaptoundecanoic acid (MUA). This may be accomplished by using molecular ratios of CdSe to MUA ranging between about 1:3 and 1:10, and preferably 1:5. In this example, a molecular ratio between CdSe and MUA of about 1:5 is used. The mercaptoundecanoic acid is then dissolved in methanol. The pH balance of the MUA-methanol solution is adjusted to be greater than 10 preferably using tetramethylammonium hydroxide pentahydrate (TMAH).

In the absence of light, the precipitated CdSe nanocrystals are dissolved in the MUA-methanol solution. The resulting solution is stirred under an Argon flow for about 2 hours to form mercaptoundecanoic acid (MUA)-capped CdSe nanocrystals. Ethyl acetate and ethyl ether are used to precipitate and wash (repeatedly between about 2 and 3 times) the MUA-capped CdSe nanocrystals. Subsequently, the MUA-capped CdSe nanocrystals preferably are dispersed in isopropanol to define a cadmium selenide (CdSe) solution.

In this example, the solution of the organic molecule, e.g., an arachidic acid solution, and the CdSe solution (containing the MUA-CdSe nanoparticles in isopropanol) are mixed to yield a molar ratio of about 1:1 of the arachidic acid and the MUA-CdSe, defining a mixed solution to nucleate a growth of the organic molecule on the inorganic nanoparticle deposited on a substrate, yielding the particle-rod nanostructure. In this example of the present invention, the method further includes spin-coating the mixed solution. To accomplish this, the mixed solution is dispensed onto freshly cleaved highly oriented pyrolytic graphite (HOPG) and spun at between about 1000 and 5000 rpm, preferably at about 3,000 rpm, for about 60 seconds. A layer is then formed on the HOPG substrate. The relatively low solubility of the arachidic acid allows for the arachidic acid to then precipitate out and form an arachidic acid stripe phase layer on the HOPG substrate layer.

Although not wanting to be limited by theory, it is believed that as the solvent evaporates during spinning the nanoparticles superficially trap remaining solvent thereabout. During spinning, the nanoparticles are then deposited on the stripe phase layer. It is believed that the formation of the stripe phase layer allows the nanoparticles to deposit thereon due to an affinity between the capping agent (MUA) and the organic molecule (arachidic acid). The nanoparticles serve as a defect within the stripe phase layer, lowering the critical energy of crystallization of the organic molecule. Thus, when its critical size is reached, the organic molecule crystallizes on the surface of the nanoparticle. The trapped solvent about the nanoparticles and the nucleation driving force and kinetics allow crystallization growth in a one-dimensional pattern defining the particle-rod nanostructure.

Figures 3, 4:
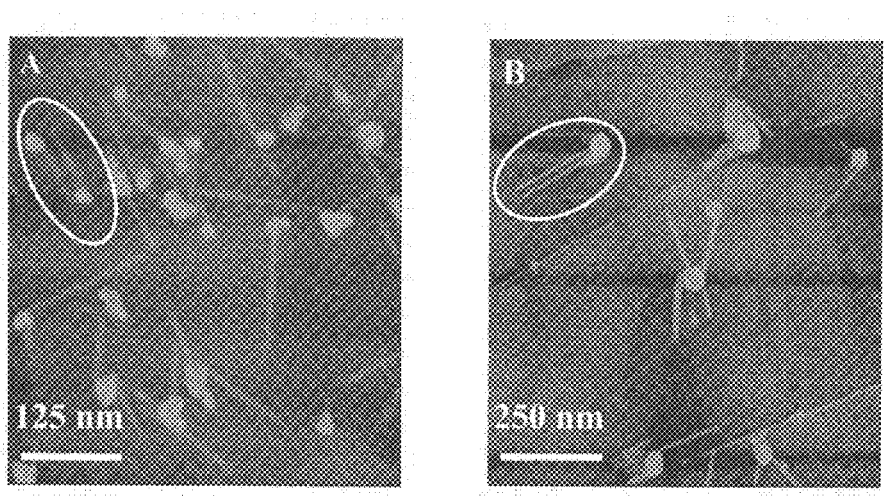
FIG. 3 is an atomic force microscopy (AFM) image of spin-coated particle-rod nanostructures in accordance with one example of the present invention.
FIG. 4 is another AFM image of spin-coated particle-rod nanostructures.

FIGS. 3 and 4 are AFM images of the arachidic acid film spin-coated from isopropanol depicting the stripe phase layer of this example. In this example, the stripe phase layer has a film thickness of 0.4 nm and a bilayer periodicity of 5.6 nm. Spin coating of the MUA-CdSe isopropanol solution was found to yield relatively few particles trapped on the HOPG layer. However, when a stripe phase layer is spin-coated from a mixed isopropanol solution of arachidic acid and MUA-CdSe, the particle-rod hybrid structure spontaneously forms (see FIGS. 3 and 4). In this example, it was found that the particle heights may range from between about 3.5 and 30 nm.

FIGS. 5 and 6 depict TEM of uncapped and capped CdSe nanoparticles, respectively. This suggests that the relatively smaller particles (between about 3.5 and 15 nm) are discrete particles, whereas the relatively larger particles (between about 15 and 30 nm) are aggregates formed upon MUA photooxidation. In the results of this example, the organic crystalline rods have relatively identical height (0.95±0.09 nm) and width (5.39±0.05 nm) but a length distribution (between about 50 nm and 250 nm). The number of rods per particle varies with the molar ratio of MUA to CdSe.

In one example, when the molar ratio of MUA:CdSe=0.38:1, the average number of rods per particle is about 1.9. An average of 2.8 rods emanate from each particle, when MUA:CdSe=0.50:1. As shown, the organic crystalline rods radiating from the inorganic nanoparticles display random orientations unlike the stripe phase layer, which exhibits the three-fold symmetry of the HOPG substrate layer. An analysis of multiple images indicates that relatively high percentages (approximately 40%) of rods are substantially parallel to each other with a center-to-center separation of about 18 nm.

Figure 8:
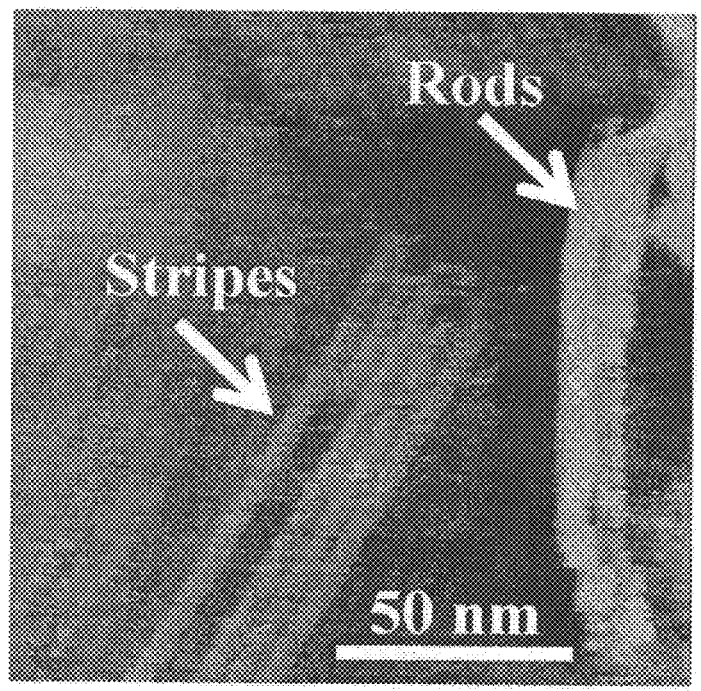
FIGS. 8 and 9 are AFM images of consecutive scans of the same area of a spin-coated particle-rod nanostructure in accordance with one example of the present invention.
Figure 9:
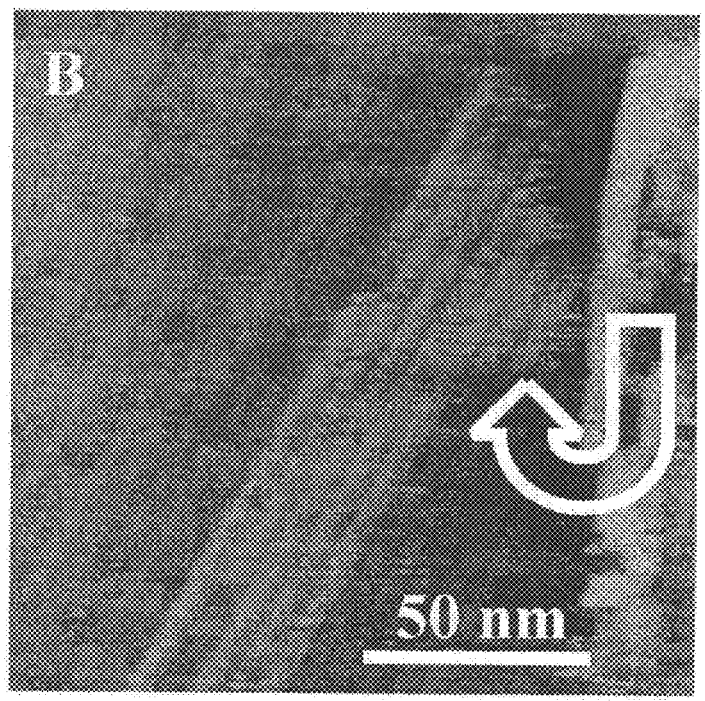

FIG. 8 shows that the particle-rod nanostructure forms on the stripe phase layer that precipitated on the substrate. FIG. 9 shows that some organic molecules are transferred from the organic rods to the stripe phase layer (indicated by the arrow) by the scanning tip in a subsequent scan of the same area. The transferred organic molecules provide support that the rods are made of the same organic molecules (here arachidic acid molecules). The length of the stripe phase layer in FIG. 9 is about 280 nm (two new stripes plus the extension of the existing stripes) and about 140 nm of the molecular rod is lost. This shows that the rods include about twice the number of organic molecules as the stripe phase layer of the same length.

Upon solvent evaporation during spin coating in this example, the organic molecule precipitates first to self-assemble into the ordered stripe phase layer due to its low solubility and one-dimensional epitaxial interaction with the HOPG lattice. In this example, it is believed that the arachidic acid monolayer immobilizes the MUA-CdSe nanoparticles, which likely trap a small amount of liquid by defect pinning of the three-phase line during the last stage of solvent evaporation. Upon continued evaporation, the nanoparticles deposit on the stripe phase layer and heterogeneous nucleation of an organic rod is induced by the nanoparticles, resulting in the one-dimensional growth of the organic molecular crystals (here arachidic acid crystals). The rod formation may be due to the presence of a highly curved surface of the nanoparticle or as a result of strong undercooling conditions of the spin coating, which also favors unidirectional growth with the growth direction substantially perpendicular to the growing interface.

Although not wanting to be limited to theory, it is believed that the intermolecular forces between alkyl chains favor parallel attachment of the zigzag chain plane of the organic molecule to the interface. The results show that the nanoparticles serve as nano-seeds in nucleating nano-size crystalline rods composed of organic molecules, in which the cross-sectional area is defined by one unit cell. The intermolecular forces between MUA and the solvent are a likely factor for the liquid pinning because without MUA, the CdSe nanoparticles may not be dispersible and therefore may not be wettable by the solvent. In this example, the mutual interactions between MUA and arachidic acid (either hydrogen bonding at their terminal carboxylate groups or non-polar interactions between the respective alkyl chains) allow the CdSe particles to be immobilized on the substrate, and may also be responsible for the heterogeneous nucleation of the arachidic acid rods.

EXAMPLE

This example provides a method of forming a particle-rod nanostructure for use in various applications, e.g., electronic, optical, and bio-sensing applications. In this example, the following chemical solutions and components were purchased or prepared: trioctylphosphineoxide (TOPO, 90%), CdO (99.99%), Se powder (99.5%), trioctylphosphine (TOP, 90%), 11-mercaptoundecanoic acid (MUA, 95%), tetramethylammonium hydroxide pentahydrate (TMAH, 97%) (purchased from Sigma-Aldrich Corp.), ethyl acetate and ethyl ether (purchased from Fisher Scientific) and n-tetradecylphosphonic acid (TDPA, 98%) (purchased from Alfa Aesar Co.).

The high-temperature CdSe nanoparticle synthesis was performed. In the synthesis of CdSe nanocrystals, 0.0514 gram (g) of CdO, 0.1116 g of TDPA, and 3.7768 g of TOPO were slowly heated to between about 300° C. and 320° C. under Ar flow. At about 300° C., the reddish brown CdO powder dissolved in the TOPO-TDPA mixture to form a homogeneous colorless solution. The temperature of the solution was then cooled to about 270° C., and a selenium stock solution (0.0314 g of Se powder in 2.4 mL of TOP) was quickly injected in to the TOPO-TDPA mixture. The resultant CdSe nanocrystals were grown at about 250° C. for about 4 hours and precipitated with methanol. This completed the high-temperature cadmium selenide nanoparticle synthesis.

Thiol coating of CdSe nanocrystals was then performed using varying molecular ratios of CdSe:MUA at 1:3, 1:5, and 1:10. An amount (e.g., 0.4672 g of MUA, if CdSe:MUA ratio is 1:5) of MUA was dissolved in 15 mL of methanol. The pH of the resulting solution was adjusted to greater than about 10 by using tetramethylammonium hydroxide pentahydrate. In the absence of light, the methanol-precipitated CdSe nanocrystals were dissolved in the above mixture and the resulting solution was stirred under Ar flow for 2 hours. Ethyl acetate and ethyl ether were used to precipitate and wash thrice the MUA-capped nanocrystals, which were then dispersed in isopropanol to form the CdSe solution.

A TEM analysis (see FIGS. 5 and 6) was conducted in bright-field mode using a JEOL FastEM 2010 HR TEM electron microscope with a $LaB_6$ thermoelectric emission gun working at 200 kV. As-prepared nanocrystals were dissolved in methanol, and placed on a 200-mesh copper carbon grid. The solvent was dried by evaporation. A number of SEM images were obtained using a Hitachi S-2400 microscope at 25 keV in secondary electron mode. Vacuum dried (under dark conditions) CdSe-MUA nanocrystals were spread on carbon adhesive tabs on an aluminum stub. An in-situ EDAX unit (EDAX Inc. PV 9900) attached to the SEM was used to determine the elemental composition of the CdSe-MUA nanoparticles (see the table of FIG. 7).

Stock solutions of arachidic acid (>99%, Sigma-Aldrich) and MUA-CdSe nanoparticles in isopropanol (Fisher Scientific, spectranalyzed) were mixed to yield about 0.1 mM arachidic acid and about 0.1 mM MUA-CdSe nanoparticles. About 100 μL of the mixed solution was dispensed onto a freshly cleaved HOPG surface spinning at 3000 rpm for 60 seconds. The spin-coated samples were imaged (FIGS. 3, 4, 8, 9) using a Dimension 3100 AFM (Veeco Metrology). Height, amplitude, and phase images were obtained in Tapping Mode in ambient air with silicon tips (TESP, Veeco) using a scan rate of 1 Hz. Integral and proportional gains were found to be approximately 0.3 and 0.5, respectively. The films were imaged (FIGS. 3, 4, 8, 9) after film preparation. The crystal structure of stearic acid was constructed with the Materials Studio software program (Accelrys, Inc.).

Further description of the present invention may be found in "Particle-Rod Hybrids: Growth of Arachidic Acid Molecular Rods From Capped Cadmium Selenide Nanoparticle," *Journal of the American Chemical Society*, Vol. 126, pp 16290-16291 (25 Nov. 2004), Dongzhong Chen et al., the entire contents of which are incorporated herein by reference.

While various embodiments for carrying out the invention have been described in detail, those familiar with the art to which this invention relates will recognize various alternative designs and embodiments for practicing the invention as defined by the following claims.

The invention claimed is:

1. A particle-rod nanostructure comprising:
    an inorganic nanoparticle coated with a capping agent; and
    one or more organic crystalline rods nucleated on the capped inorganic nanoparticle in a one-dimensional growth pattern.

2. The nanostructure of claim 1 wherein the organic rods are of uniform size.

3. The nanostructure of claim 1 wherein the diameter of the nanoparticle is between about 2 nanometers (nm) and 30 nm.

4. The nanostructure of claim 1 wherein the observed molar ratio between the nanoparticle and the capping agent is between about 1:0.1 and 1:1.

5. The nanostructure of claim 1 wherein the inorganic nanoparticle includes one of cadmium selenide nanocrystals, metal chalcogenide nanoparticles, gold nanoparticles, and mixtures thereof.

6. The nanostructure of claim 1 wherein the capping agent includes alkanes modified with thiols at one end and carboxylic acid groups at another end.

7. The nanostructure of claim 6 wherein the carboxylic acid groups include one of mercaptoundecanoic acid (MUA), mercaptohexadecanoic acid (MHA), and mixtures thereof.

8. The nanostructure of claim 1 wherein the organic crystalline rod is formed from an organic molecule, wherein the organic molecule includes one of carboxylic acids, phospholipids, metal ion complexes with fatty acids, and mixtures thereof.

9. The nanostructure of claim 8 wherein the carboxylic acids include one of arachidic acid, stearic acid, and mixtures thereof; the phospholipids include one of 1,2-dimyristoyl-sn-glycero-3-phosphoethanolamine, 10,12-pentacosadiynoic acid, and mixtures thereof; and the metal ion complexes with fatty acids include one of copper (II) arachidate, manganese (II) arachidate, and mixtures thereof.

10. A particle-rod nanostructure comprising:
    a mercaptoundecanoic acid-capped cadmium selenide nanoparticle; and
    one or more arachidic acid single-crystalline rods nucleated on the mercaptoundecanoic acid-capped cadmium selenide nanoparticle in a one-dimensional growth pattern.

11. The nanostructure of claim 10 wherein the nanoparticle has a diameter between about 2 nm and 30 nm.

12. The nanostructure of claim 10 wherein each arachidic acid single-crystalline rod has a height of about 0.95 nanometers and a width of about 5.39 nanometers, and the arachidic acid single-crystalline rods have a length distribution of between about 50 and 250 nanometers.

13. The nanostructure of claim 10 wherein the molecular ratio of cadmium selenide to mercaptoundecanoic is between about 1:3 and 1:10.

* * * * *